(12) United States Patent  
Fukui

(10) Patent No.: US 7,289,375 B2  
(45) Date of Patent: Oct. 30, 2007

(54) DATA HOLDING CIRCUIT

(75) Inventor: Hironobu Fukui, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 11/444,526

(22) Filed: Jun. 1, 2006

(65) Prior Publication Data

US 2007/0097728 A1 May 3, 2007

(30) Foreign Application Priority Data

Oct. 28, 2005 (JP) ............................. 2005-314711

(51) Int. Cl.
*G11C 7/10* (2006.01)
*H03K 19/003* (2006.01)

(52) U.S. Cl. ...................... 365/189.05; 365/200; 326/9

(58) Field of Classification Search ............ 365/189.05
See application file for complete search history.

(56) References Cited

U.S. PATENT DOCUMENTS

| | | | |
|---|---|---|---|
| 4,868,420 A | | 9/1989 | Itoh et al. |
| 5,473,185 A | * | 12/1995 | Pfiester et al. ............... 257/399 |
| 5,608,674 A | * | 3/1997 | Yabe et al. ............ 365/189.05 |
| 6,327,176 B1 | * | 12/2001 | Li et al. ...................... 365/156 |
| 6,369,630 B1 | * | 4/2002 | Rockett ...................... 327/210 |
| 6,377,098 B1 | * | 4/2002 | Rebeor ....................... 327/210 |
| 6,476,643 B2 | * | 11/2002 | Hugues et al. ................ 326/93 |
| 6,703,858 B2 | * | 3/2004 | Knowles ......................... 326/9 |
| 6,809,957 B2 | * | 10/2004 | Lesea ......................... 365/154 |
| 7,061,304 B2 | * | 6/2006 | Anand et al. ............... 327/525 |
| 2003/0179031 A1 | | 9/2003 | Arima et al. |
| 2005/0116361 A1 | | 6/2005 | Fukui |

FOREIGN PATENT DOCUMENTS

JP 2003-273709 A 9/2003

OTHER PUBLICATIONS

Mark P. Baze et al., "A Digital CMOS Design Technique for SEU Hardening", *IEEE Transactions on Nuclear Science*, vol. 47, No. 6, pp. 2603-2608, Dec. 2000.
H. Fukui et al., "Comprehensive Study on Layout Dependence of Soft Errors in CMOS Latch Circuits and its Scaling Trend for 65 nm Technology Node and Beyond", *2005 Symposium on VLSI Technology Digest of Technical Papers*, pp. 222-223, Jun. 14, 2005.

* cited by examiner

*Primary Examiner*—Son L. Mai
(74) *Attorney, Agent, or Firm*—Foley & Lardner LLP

(57) ABSTRACT

A data holding circuit includes a first data holding unit, a second data holding unit and a selection unit. In the first data holding unit, a probability of a soft error at a time when input data has a first level is lower than a probability of a soft error at a time when the input data has a second level. In the second data holding unit, a probability of a soft error at a time when the input data has the second level is lower than a probability of a soft error at a time when the input data has the first level. The selection unit selects an output from the first data holding unit when the input data has the first level, and selects an output from the second data holding unit when the input data has the second level.

20 Claims, 6 Drawing Sheets

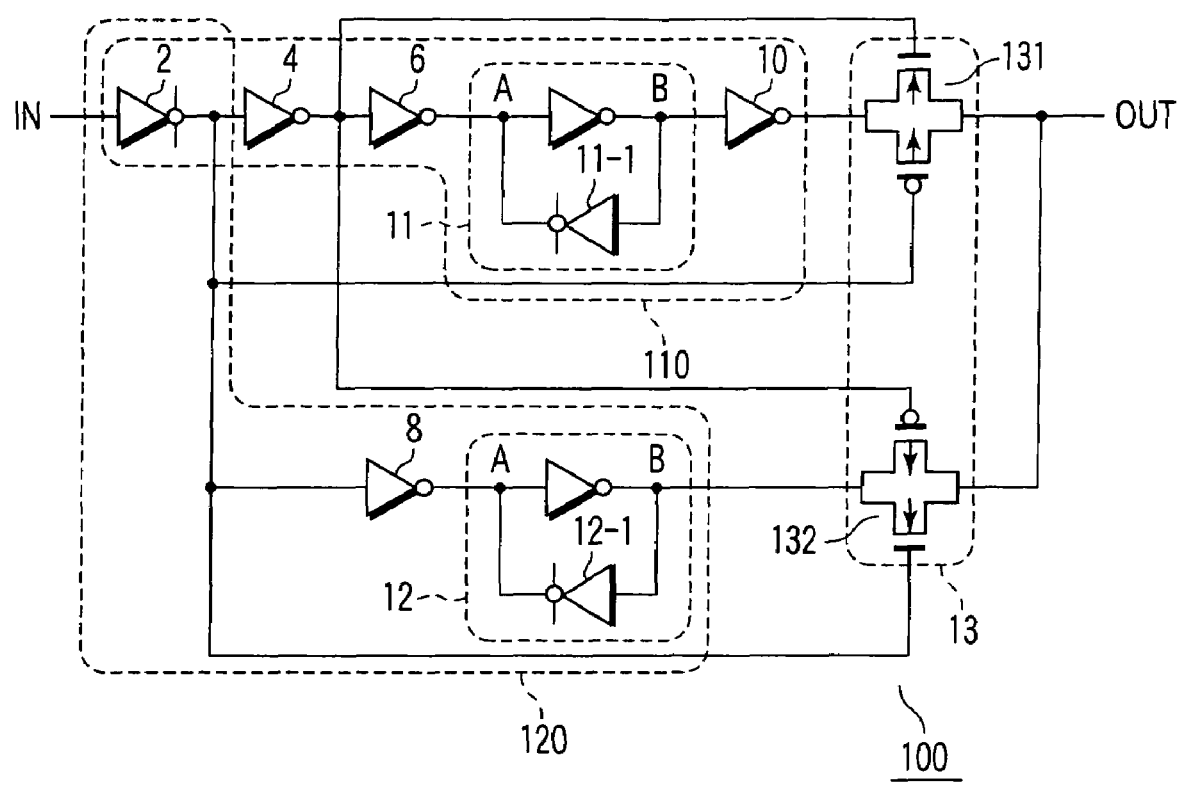
F I G. 1

DATA HOLDING CIRCUIT

CROSS-REFERENCE TO RELATED APPLICATIONS

This application is based upon and claims the benefit of priority from prior Japanese Patent Application No. 2005-314711, filed Oct. 28, 2005, the entire contents of which are incorporated herein by reference.

BACKGROUND OF THE INVENTION

1. Field of the Invention

The present invention relates generally to a data holding circuit using, e.g. a latch circuit, and more particularly to a data holding circuit in which the probability of malfunction due to a soft error is reduced.

2. Description of the Related Art

With development in fine patterning of an LSI device, a charge representing 1 bit decreases. This leads to the increase in the possibility of occurrence of soft errors or soft error rate. Beyond 65 nm technology node, it is important to improve soft error tolerance.

In general, LSI circuits are classified into two groups: memory circuits and logic circuits. In the case of the memory circuit, soft errors can be suppressed effectively by adding a redundant bit to the data stored in the circuit. However, an effective countermeasure to soft errors, which is applicable to the logic circuit, has not yet been established.

The logic circuits can be classified into combinational logic circuits and data holding circuits. In the case of the combinational logic circuit, even if data temporarily upsets, it restores to the initial state unless data in the preceding stage upsets. Thus, soft errors in the combinational logic circuits have the small effect on the circuit operation. On the other hand, in the case of the data holding circuit, if data once upsets, it never restores until the right data is rewritten. Thus, soft errors in the data holding circuits are the serious in the operation.

As a general countermeasure to soft errors in the data holding circuit, a majority voting circuit has been proposed (see, e.g. Mark P. Baze, Steven P. Buchner, and Dale McMorrow, "A digital CMOS Design Technique for SEU Hardening", IEEE Transactions on Nuclear Science, Vol. 47, No. 6, p. 2603, December 2000). The majority voting circuit, however, requires an odd number (at least three) of identical circuits. In addition, a circuit determining which output is right is also required. These lead to the significant increase in the chip area. Under the circumstances, there has been a demand for a data holding circuit that has a high tolerance to soft errors, while suppressing an increase in chip area.

BRIEF SUMMARY OF THE INVENTION

According to an aspect of the present invention, there is provided a data holding circuit comprising: a first data holding unit in which a probability of a soft error at a time when input data has a first level is lower than a probability of a soft error at a time when the input data has a second level; a second data holding unit in which a probability of a soft error at a time when the input data has the second level is lower than a probability of a soft error at a time when the input data has the first level; and a selection unit that selects an output from the first data holding unit when the input data has the first level, and selects an output from the second data holding unit when the input data has the second level.

BRIEF DESCRIPTION OF THE SEVERAL VIEWS OF THE DRAWING

FIG. 1 shows a data holding circuit according to a first embodiment of the present invention;

DETAILED DESCRIPTION OF THE INVENTION

Figure 2A:
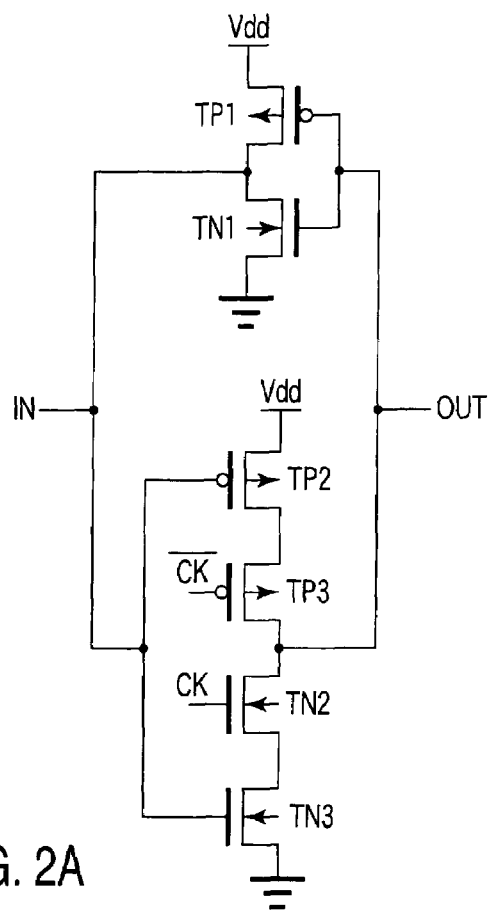
FIG. 2A is a transistor-level circuit diagram of a latch circuit.

Embodiments of the present invention will now be described with reference to the accompanying drawings.

FIRST EMBODIMENT

FIG. 1 shows the structure of a data holding circuit according to a first embodiment of the present invention. A data holding circuit 100 comprises two latch circuits 11 and 12, a selector circuit 13, inverters 4, 6, 8 and 10, and a clocked inverter 2.

Figure 9:
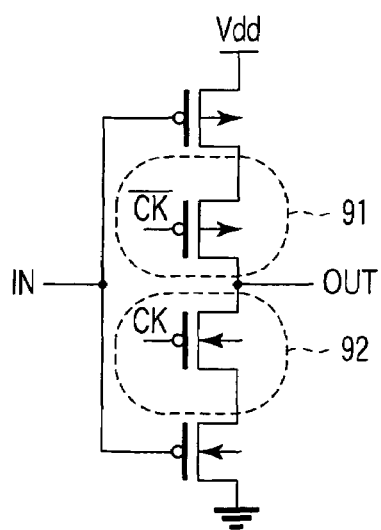
FIG. 9 shows a circuit structure of a clocked inverter.

FIG. 9 shows a circuit structure of the clocked inverters 2, 11-1 and 12-1. The clocked inverter transmits a signal to a subsequent circuit in sync with a clock signal. The transistors 91 and 92 are controlled by the clock signal. When the transistors 91 and 92 are conductive ("ON state"), an inverted value of an input (IN) is output. When the transistors 91 and 92 are not conductive ("OFF state"), an output (OUT) is unchanged since the entire circuit is in a shut-off state even if the value of the input varies.

In FIG. 1, clock signals, which are inverted relative to each other, are input to the clocked inverter 2 and to the clock inverters 11-1 and 12-1. When the data is written, the circuits operate as follows. In clocked inverter 2, transistors controlled by the clock signal become conductive. On the other hand, in the clocked inverters 11-1 and 12-1, transistors controlled by the clock signal become non-conductive. Consequently, a node A of each of the latch circuits 11 and 12 is charged up to a level corresponding to an input IN. In this case, an input node of the inverter in the latch circuit is defined as the node A.

When data is held, the circuits operate as follows. In the clocked inverter 2, the transistors controlled by the clocked signal become non-conductive. On the other hand, in the clocked inverters 11-1 and 12-1, the transistors controlled by the clocked signal become conductive.

In this case, even if the input data to the clocked inverter 2, that is, data IN, varies, the state of the node A remains unchanged.

The data IN, which is the input data to the data holding circuit 100, is input to the latch circuit 11 via the clocked inverter 2 and the inverters 4 and 6. The data IN is also input to the latch circuit 12 via the clocked inverter 2 and the inverter 8. Because of the difference in the number of inverters through which the data IN passes, the input to the latch circuit 12 is an inverted one relative to the input to the latch circuit 11. However, since the inverter 10 is provided at the output terminal of the latch circuit 11, the output from the inverter 10 is equal to the output from the latch circuit 12.

The clocked inverter 2, inverters 4, 6 and 10 and latch circuit 11 constitute a first data holding unit 110. The clocked inverter 2, inverter 8 and latch circuit 12 constitute a second data holding unit 120. The outputs from the first data holding unit 110 and the second data holding unit 120 are input to the selector circuit 13.

The selector circuit 13 is composed of two transmission gates 131 and 132. The output from the inverter 10 is input to the transmission gate 131, and the output from the latch circuit 12 is input to the transmission gate 132. Each of the transmission gates comprises a p-channel MOS field-effect transistor (hereinafter referred to as "PFET") and an n-channel MOS field-effect transistor ("NFET"), whose sources and drains are commonly connected. When the gate potential of the PFET is Low level and the gate potential of the NFET is High level, a signal is transmitted. When the gate potential of the PFET is High level and the gate potential of the NFET is Low level, the transmission gate is in the shut-off state and no signal is transmitted.

The gate of the NFET of the transmission gate 131 is connected to the output of the inverter 4, and the gate of the PFET of the transmission gate 131 is connected to the output of the clocked inverter 2. The gate of the NFET of the transmission gate 132 is connected to the output of the clocked inverter 2, and the gate of the PFET of the transmission gate 132 is connected to the output of the clocked inverter 4.

Thus, while the data is being input to the data holding circuit 100, the signal is always transmitted via one of the transmission gates 131 and 132, and the other of the transmission gates 131 and 132 is set in the non-conductive state. Hence, the selector circuit 13 comprising the transmission gates 131 and 132 has the function of selecting one of the outputs from the latch circuits 11 and 12. The output from the selected latch circuit becomes data OUT that is the output data of the data holding circuit 100. When the latch circuit 11 is selected, the output from the inverter 10 becomes data OUT. The output data OUT always has an inverted value of the input signal.

When data at the node A, which is the input data to the latch circuit 11, 12, is 1, the probability of the inversion of data from 1 to 0 due to a soft error is defined as $P_{A,HL}$. When data at the node A is 0, the probability of the inversion of data from 0 to 1 due to a soft error is defined as $P_{A,LH}$.

In the first embodiment, in each of the two latch circuits 11 and 12, the probability of the inversion of data from 0 to 1 due to a soft error is lower than the probability of the inversion of data from 1 to 0 due to a soft error. In other words, the latch circuits 11 and 12 are designed to establish $P_{A,LH} < P_{A,HL}$. For the purpose of easy comparison with the prior art, it is assumed that the $P_{A,LH}$ of the latch circuit 11 is equal to the $P_{A,LH}$ of the latch circuit 12.

Next, the operation of the data holding circuit according to the present embodiment is described. As described above, the selector circuit 13 selects the first data holding unit 110 or the second data holding unit 120, depending on the input data to the data holding circuit 100, that is, the data IN. The data at the node A of the latch circuit in the selected data holding unit is 0. Specifically, depending on the data IN, the data holding unit including the latch circuit, in which the data at the node A is 0, is selected. In other words, the selector circuit 13 always selects the data holding unit that uses, as the data holding state, the state in which the probability of a soft error is lower.

Accordingly, when the input data IN is 1, the data at the node A of the latch circuit 11 becomes 0 and thus the output from the first data holding unit 110 is selected. When the input data IN is 0, the data at the node A of the latch circuit 12 becomes 0 and thus the output from the second data holding unit 120 is selected. As a result, regardless of the input data to the data holding circuit 100, the probability that the data held in the data holding circuit 100 is inverted is $P_{A,LH}$.

Now consider the case of a conventional data holding circuit that comprises only a single latch circuit. In this case, one single latch circuit shown in FIG. 1 is regarded as the data holding circuit. On the basis of the probability of occurrence of a soft error in this latch circuit, a soft error rate $S_1$ of a circuit comprising many data holding circuits is calculated. The soft error rate $S_1$ is given by:

$$S_1 = k(p_0 P_{A,LH} + p_1 P_{A,HL}) \quad (1)$$

where $p_0$ and $p_1$ are probabilities of input of 0 and 1 in the circuit, and k is a proportionality constant that represents, e.g. the number of data holding circuits per unit area. Since $p_0 + p_1 = 1$, the equation (1) is developed to:

$$S_1 = k\{P_{A,LH} + p_1(P_{A,HL} - P_{A,LH})\} \quad (2)$$

On the other hand, a soft error rate $S_2$, which is based on the data holding circuit of this embodiment, is given by:

$$S_2 = k P_{A,LH} \quad (3)$$

By comparing the equations (2) and (3), it is understood that the probability of a soft error decreases in the data holding circuit of this embodiment as $p_1$ is closer to 1 and as the difference between $P_{A,HL}$ and $P_{A,LH}$ is greater. For the purpose of simple comparison with the prior art, it is assumed that the $P_{A,LH}$ of the latch circuit 11 is equal to the $P_{A,LH}$ of the latch circuit 12. If both the two latch circuits meet the condition, $P_{A,LH} < P_{A,HL}$, the $P_{A,LH}$ of the latch circuit 11 may not necessarily be equal to the $P_{A,LH}$ of the latch circuit 12.

The data holding circuit of the present embodiment comprises two latch circuits, one selector circuit, and a plurality of inverters. On the other hand, in the case where a majority voting circuit is used as a countermeasure to soft errors, an odd-number of latch circuits and a circuit for determining majority are needed. Therefore, the present embodiment realizes a data holding circuit in which the soft error rate is reduced, the structure is simple, and the required chip area is reduced.

Figure 2B:
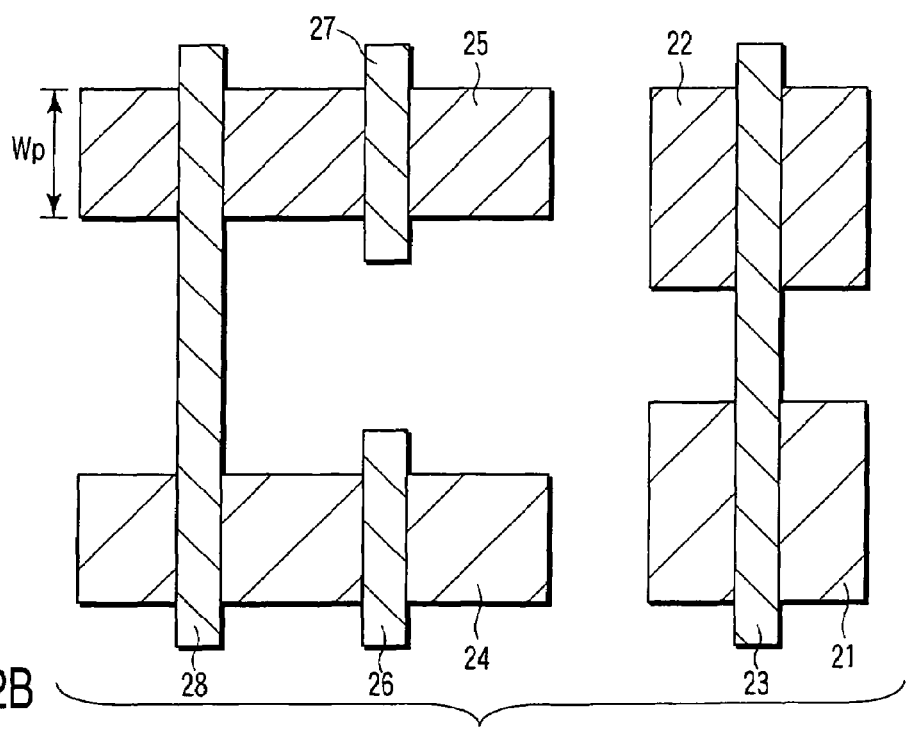
FIG. 2B shows a layout in which depiction of wiring lines in FIG. 2A is omitted.

In the design of latch circuits, it is confirmed by experiments that the values of $P_{A,LH}$ and $P_{A,HL}$ can be controlled by adjusting the dimensions of layout. FIG. 2A and FIG. 2B show an example of the latch circuit. FIG. 2A is a transistor-level circuit diagram of the latch circuit. The latch circuit comprises transistors TN1, TN2 and TN3, which are NFETs, and transistors TP1, TP2 and TP3, which are PFETs. FIG. 2B shows a layout in which depiction of wiring lines in FIG. 2A is omitted. In FIG. 2B, the latch circuit comprises a source/drain 21 of TN1, a source/drain 22 of TP1, a gate 23 of TN1 and TP1, a source/drain 24 of TN2 and TN3, a source/drain 25 of TP2 and TP3, a gate 26 of TN2, a gate 27 of TP3, and a gate 28 of TN3 and TP2.

In FIG. 2B, the probability of soft errors can greatly be varied, for example, by adjusting only the channel width (i.e. the width of source/drain of TP2, TP3) Wp, while fixing the channel width of each NFET.

By increasing Wp, the channel resistance of the PFET decreases. This enhances the transport performance by which a charge that is generated by neutron radiation, etc. in the source/drain 24 of the TN2 and TN3 is moved to power supply voltage (Vdd) via the TP2 and TP3. Thereby, the stability of high potential of output is enhanced, and the probability that the output of the latch circuit is inverted from high potential (1) to low potential (0) due to a soft error is decreased. In short, the probability of occurrence of a soft error can greatly be varied.

Figure 3:
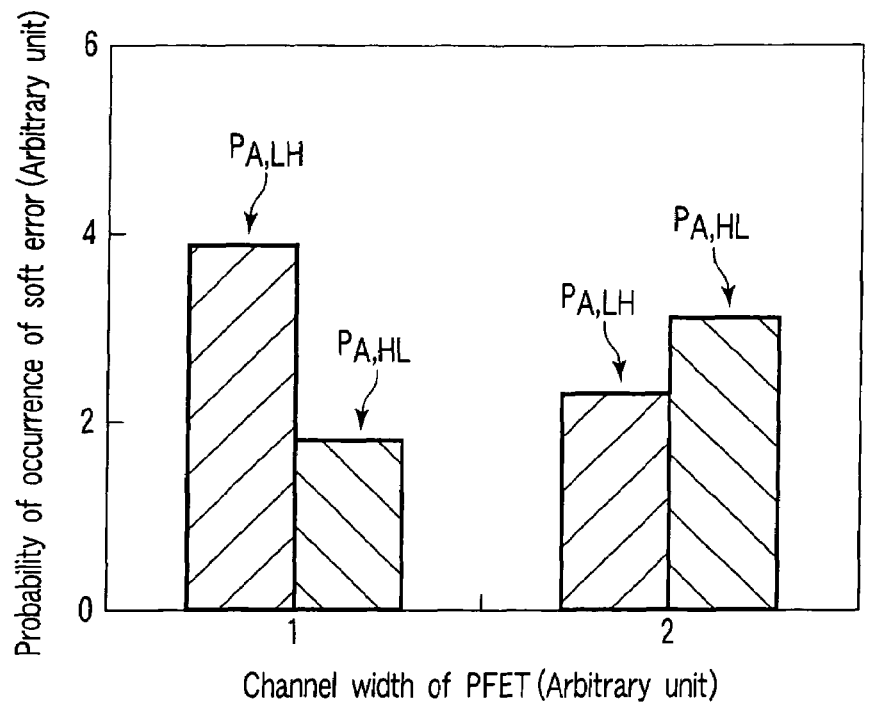
FIG. 3 is a graph showing the relationship between the probability of occurrence of a soft error and the channel width of a PFET.

FIG. 3 is a graph showing the relationship between the probability $P_{A,LH}$, $P_{A,HL}$ of occurrence of a soft error and the channel width Wp of the PFET. FIG. 3 shows that the initial relationship of $P_{A,LH} > P_{A,HL}$ is changed to $P_{A,LH} < P_{A,HL}$ by doubling the channel width Wp of the PFET. In this manner, by adjusting, for example, the channel width of the PFET, the latch circuit with a desired resistance to soft errors can be realized.

In addition, it is known by experiments that the carrier mobility is increased by applying stress to the channel at the time of fabricating the PFET. The resistance to soft errors can also be increased by making use of this technique and increasing the current driving power.

In the first embodiment, the latch circuits are formed to have the same layout, that is, the same probability of occurrence of soft errors. On the other hand, there is such a case that the occurrence of soft errors needs to be avoided as much as possible in some of the data holding circuits, and not in all the data holding circuits. In such a case, latch circuits are formed with different layouts in order to use the above-described approach, even if the processing speed or power consumption in some of the circuits is sacrificed.

Figure 4:
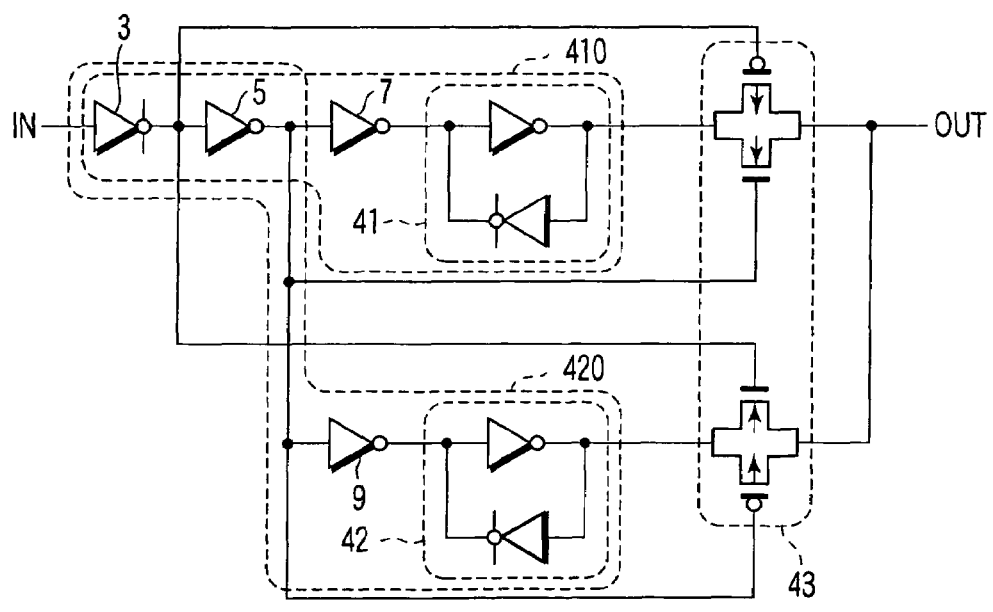
FIG. 4 shows a modification of the data holding circuit according to the first embodiment of the invention.

FIG. 4 shows the structure of a data holding circuit according to a modification of the first embodiment, wherein the above-described case is assumed. A data holding circuit 400 comprises two latch circuits 41 and 42, one selector circuit 43, one clocked inverter 3, and three inverters 5, 7 and 9. The outputs from the latch circuits 41 and 42 are input to the selector circuit 43.

An input data (IN) is transmitted through the clocked inverter 3 and the inverter 5. The transmitted data is stored in the latch circuits 41 and 42 via the inverters 7, 9. Either the data stored in the latch circuit 41 or the data stored in the latch circuit 42 is selected as an output data (OUT) by the selector circuit 43. The output data (OUT) has the same value of the input data (IN) in the data holding circuit 400.

In FIG. 4, the clocked inverter 3, inverters 5 and 7 and latch circuit 41 constitute a first data holding unit 410. The clocked inverter 3, inverters 5 and 9 and latch circuit 42 constitute a second data holding unit 420.

The $P_{A,LH}$ and $P_{A,HL}$ in the latch circuit 41 are defined as $P_{A,LH}$ (41) and $P_{A,HL}$ (41), and the $P_{A,LH}$ and $P_{A,HL}$ in the latch circuit 42 are defined as $P_{A,LH}$ (42) and $P_{A,HL}$ (42). The two latch circuits 41 and 42 are designed to have different layouts so as to meet the following formulae:

$P_{A,LH}$ (41) < $P_{A,HL}$ (41), and $P_{A,LH}$ (41) < $P_{A,LH}$ (41) (as regards the latch circuit 41), and $P_{A,HL}$ (42) < $P_{A,LH}$ (42), and $P_{A,HL}$ (42) < $P_{A,HL}$ (41) (as regards the latch circuit 42).

Next, the operation of the data holding circuit according to the modification of the embodiment is described. The selector circuit 43 selects the output of the latch circuit, that is, the data holding unit, depending on the input data to the data holding circuit 400, that is, the data IN. Specifically, when the data IN is 1, the selector circuit 43 selects the output of the first data holding unit 410. When the data IN is 0, the selector circuit 43 selects the output of the second data holding unit 420.

When the first data holding unit 410 is selected, the input to the latch circuit 41 is 0. When the second data holding unit 420 is selected, the input to the latch circuit 42 is 1. In this manner, in the case where each latch circuit uses, as the data holding state, the state in which the probability of a soft error is lower, the selector circuit 43 always selects the data holding unit that includes this latch circuit. Thereby, the occurrence of malfunction due to a soft error is reduced.

The data holding circuit of this modification, too, comprises two latch circuits, one selector circuit and a plurality of inverters. Compared to the case of using a majority voting circuit, the structure is simpler and the necessary chip area is smaller.

As has been described above, the modification of the embodiment can also realize a data holding circuit in which the chip area is smaller and the occurrence of malfunction due to a soft error is reduced.

SECOND EMBODIMENT

Figure 5:
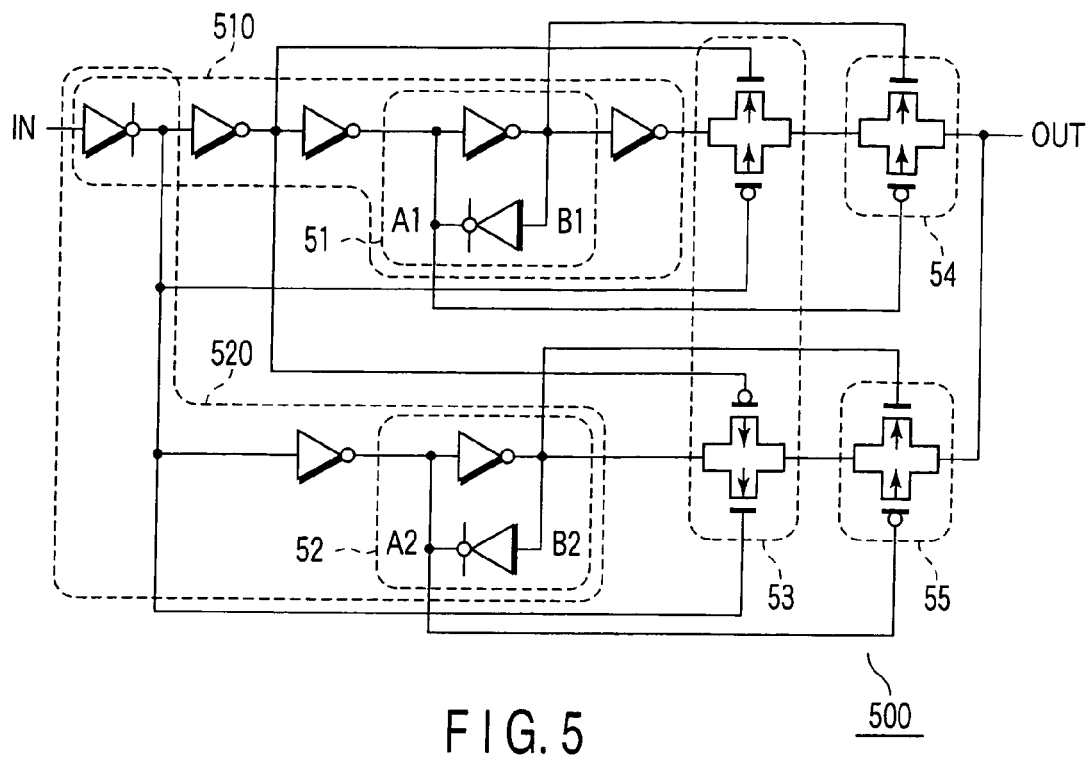
FIG. 5 shows a data holding circuit according to a second embodiment of the invention.

FIG. 5 shows the structure of a data holding circuit according to a second embodiment of the present invention. A data holding circuit 500 according to the second embodiment is configured such that transmission gates 54 and 55 are added to the circuit structure shown in FIG. 1. In the second embodiment, like the first embodiment, a selector circuit 53 selects the latch circuit, which uses the state with the lower probability of a soft error as the data holding state, depending on the input data to the data holding circuit.

The gates of the NFET and PFET of the transmission gate 54 are connected, respectively, to a node $B_1$ and a node $A_1$ of a latch circuit 51. The gates of the NFET and PFET of the transmission gate 55 are connected, respectively, to a node $B_2$ and a node $A_2$ of a latch circuit 52. In each of the latch circuits 51 and 52, the probability of the inversion of data from 0 to 1 due to a soft error is lower than the probability of the inversion of data from 1 to 0 due to a soft error. In other words, the latch circuits 51 and 52 are designed to establish $P_{A,LH} < P_{A,HL}$.

The operation of the data holding circuit of this embodiment is described with reference to FIG. 5. Assume now that either a first data holding unit 510 including the latch circuit 51 or a second data holding unit 520 including the latch circuit 52 is selected by the selector circuit 53 in accordance with input data, i.e. data IN. If a soft error occurs in the latch circuit of the selected data holding unit, data at the node of the latch circuit is inverted. Specifically, data at nodes $A_1$ and $B_1$ of the latch circuit 51 or data at nodes $A_2$ and $B_2$ of the latch circuit 52 are inverted. Then, the transmission gate 54 or 55 is set in the shut-off state. As a result, data OUT is kept in the previous state. That is, the signal that is inverted due to the soft error is not transmitted to a subsequent-stage circuit.

In the data holding circuit of this embodiment, compared to the data holding circuit of the first embodiment, the probability of malfunction due to a soft error is further reduced. In addition, since only a small number of circuit components are added to the circuit structure shown in FIG. 1, an increase in chip area is very small.

Figure 6:
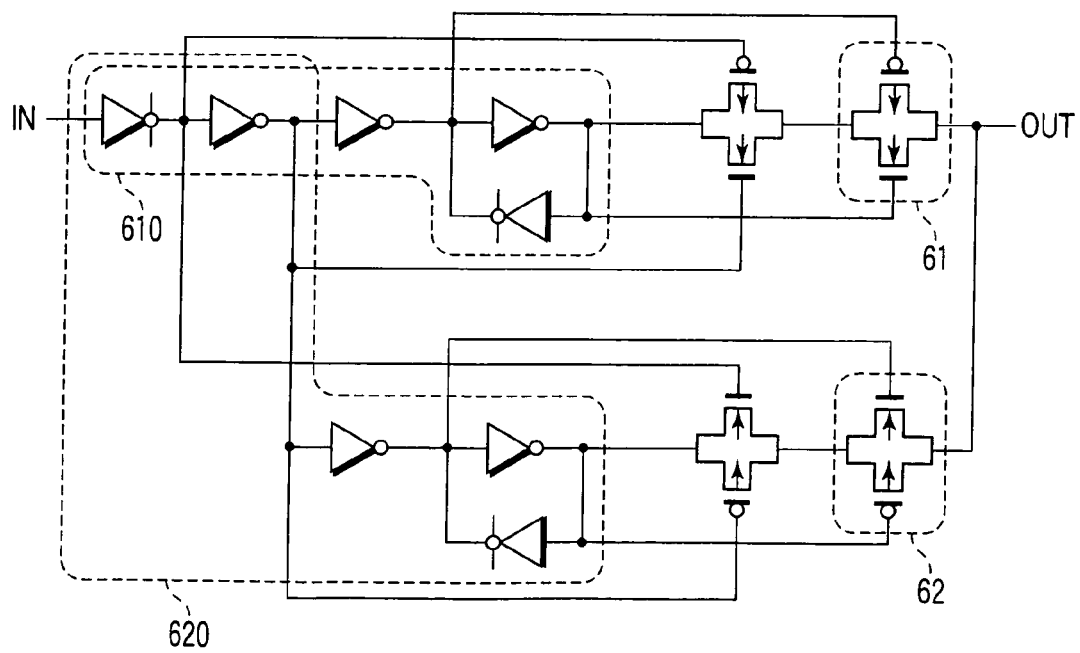
FIG. 6 shows a modification of the data holding circuit according to the second embodiment of the invention.

As regards this embodiment, a similar modification to the modification of the first embodiment, as shown in FIG. 4, may also be applied. FIG. 6 shows the structure of the modification of the data holding circuit in this case. Transmission gates 61 and 62 are added to the structure of the data holding circuit shown in FIG. 4. Of the two latch circuits, the latch circuit, which constitutes a first data holding unit 610 indicated by a broken line, is designed to meet the condition, $P_{A,LH}<P_{A,HL}$. The other latch circuit, which constitutes a second data holding unit 620 indicated by another broken line, is designed to meet the condition, $P_{A,LH}>P_{A,HL}$.

With the addition of the transmission gates 61 and 62, transmission of data, which is inverted due to a soft error, to a subsequent-stage circuit is prevented. In this modification, compared to the circuit structure shown in FIG. 4, the occurrence of malfunction due to soft errors is reduced. In addition, since only a small number of circuit components are added to the circuit structure shown in FIG. 4, an increase in chip area is very small.

THIRD EMBODIMENT

Figure 7:
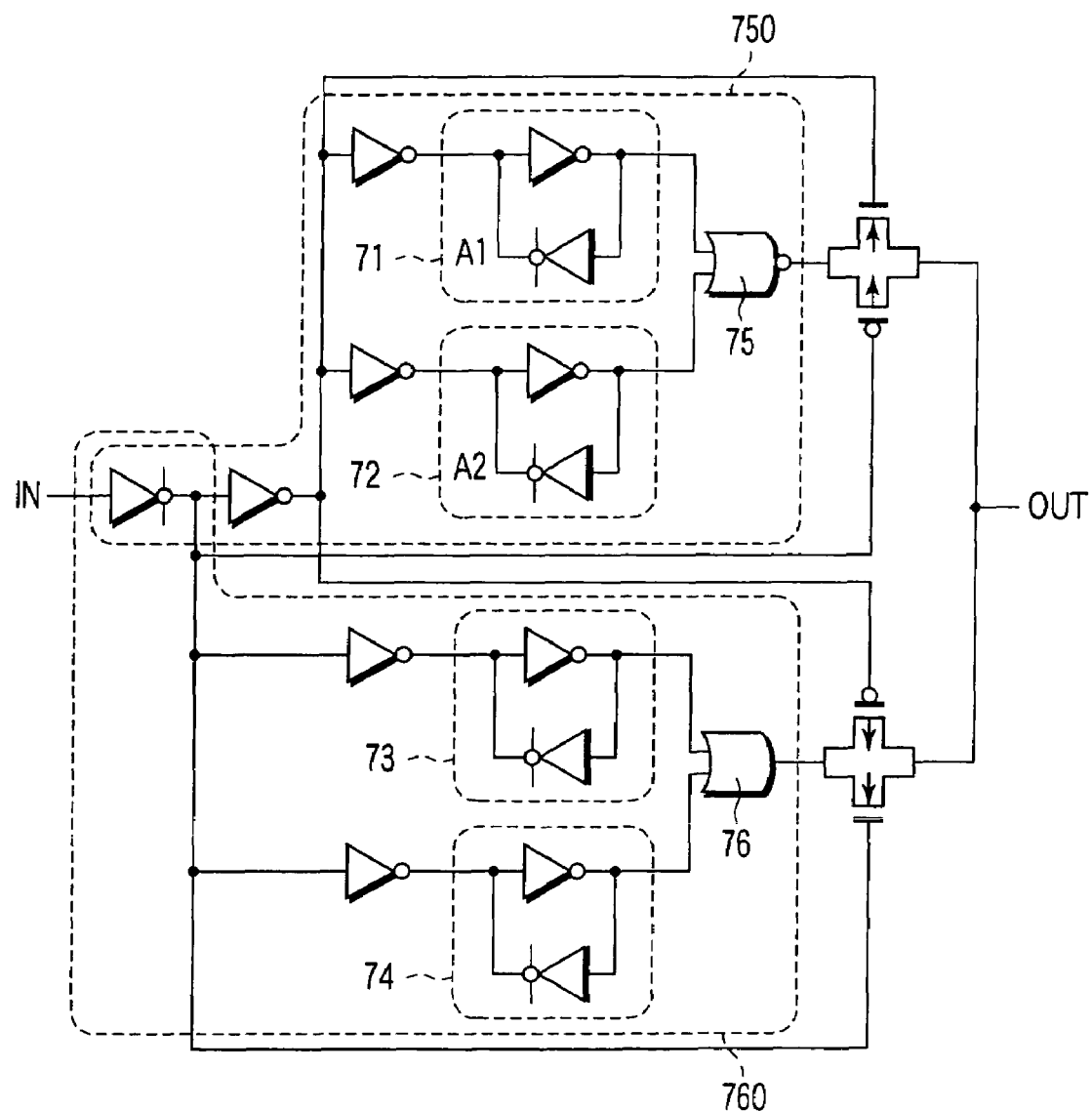
FIG. 7 shows a data holding circuit according to a third embodiment of the invention.

FIG. 7 shows the structure of a data holding circuit according to a third embodiment of the present invention. The data holding circuit of the third embodiment is configured such that another latch circuit is added to each of the two latch circuits shown in FIG. 1, and a NOR circuit 75 and an OR circuit 76 are additionally provided. In each of latch circuits 71, 72, 73 and 74, the number of which is four in total, the probability of the inversion of data from 0 to 1 due to a soft error is lower than the probability of the inversion of data from 1 to 0 due to a soft error. In other words, the latch circuits 71, 72, 73 and 74 are all designed to establish $P_{A,LH}<P_{A,HL}$.

An input to the data holding circuit shown in FIG. 7 is delivered to the four latch circuits 71, 72, 73 and 74 at the same time. Outputs from the latch circuits 71 and 72 are input to the NOR circuit 75. The latch circuits 71 and 72 and NOR circuit 75 constitute a first data holding unit 750 that is indicated by a broken line including these components. Outputs from the latch circuits 73 and 74 are input to the OR circuit 76. The latch circuits 73 and 74 and OR circuit 76 constitute a second data holding unit 760 that is indicated by a broken line including these components. Either an output from the NOR circuit 75, i.e. an output from the first data holding unit 750, or an output from the OR circuit 76, i.e. an output from the second data holding unit 760, is selected depending on the input data, i.e. data IN, to the data holding circuit, and the selected output is produced from OUT.

The operation of the data holding circuit of this embodiment is described. When input data, i.e. data IN, is 1, data at nodes $A_1$ and $A_2$ of the latch circuits 71 and 72 becomes 0. In this case, the output of the NOR circuit 75 is 0. At the same time, since the selector circuit selects the output from the NOR circuit 75, i.e. the output from the data holding unit 750, data "0" is output from OUT.

If a soft error occurs in either the latch circuit 71 or latch circuit 72, the data at the node $A_1$ or $A_2$ is inverted to 1. However, unless outputs from both latch circuits 71 and 72 are inverted, the output from the NOR circuit 75 remains "0". In short, the output of the NOR circuit 75 is inverted only when soft errors occur in the latch circuits 71 and 72 at the same time. The probability of simultaneous occurrence of soft errors in the latch circuits 71 and 72 is very low. When data IN is 0, the output from the OR circuit 76, i.e. the output from the second data holding circuit 760, is selected. The operation in this case is the same as described above.

In this embodiment, two additional latch circuits are provided. If more latch circuits are added, the occurrence of malfunction due to a soft error can further be reduced. That is, the probability that soft errors occur in all the selected latch circuits is further decreased. Hence, the probability of malfunction of the entire data holding circuit is further decreased. In this case, the number of input terminals of the OR circuit and NOR circuit in FIG. 7 is three or more.

In this embodiment, a malfunction due to a soft error occurs only when soft errors occur in all the latch circuits included in the data holding unit that is selected depending on the data IN. Therefore, this embodiment can realize a data holding circuit having a higher soft-error resistance than the majority voting circuit.

In FIG. 7, the same number of latch circuits are added to the first data holding unit 750 and second data holding unit 760. The number of latch circuits to be added may not necessarily be equal between the first data holding unit 750 and second data holding unit 760. It is possible to preferentially add latch circuits to a circuit having a higher probability of occurrence of a soft error. Thereby, the occurrence of malfunction due to a soft error can be reduced while the increase in chip area is limited to a minimum.

Figure 8:
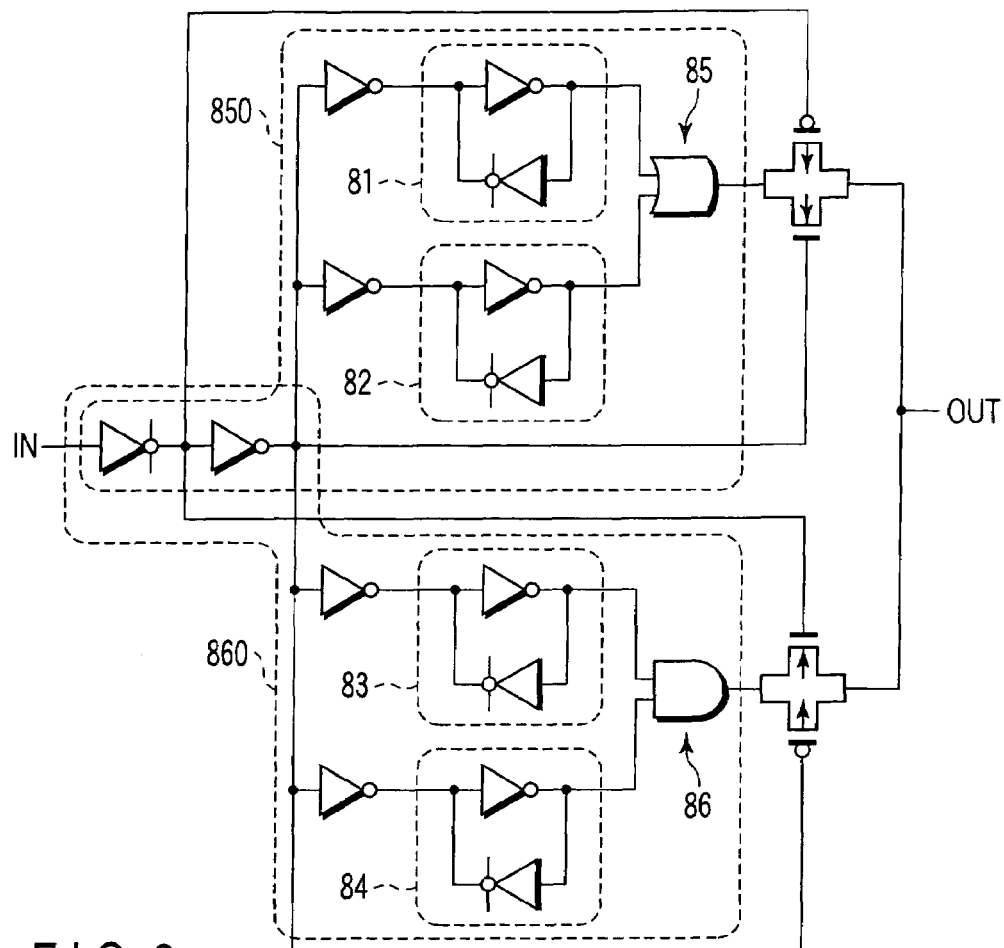
FIG. 8 shows a modification of the data holding circuit according to the third embodiment of the invention.

As regards this embodiment, a similar modification to the modification of the first embodiment, as shown in FIG. 4, may also be applied. FIG. 8 shows the structure of the modification of the data holding circuit in this case. Specifically, another latch circuit is added to each of the two latch circuits shown in FIG. 4, and an OR circuit 85 and an AND circuit 86 are provided.

Outputs from the latch circuits 81 and 82 are input to the OR circuit 85. The latch circuits 81 and 82 and OR circuit 85 constitute a first data holding unit 850 that is indicated by a broken line including these components. Outputs from the latch circuits 83 and 84 are input to the AND circuit 86. The latch circuits 83 and 84 and AND circuit 86 constitute a second data holding unit 860 that is indicated by a broken line including these components. The latch circuits 81 and 82 are designed to meet the condition, $P_{A,LH}<P_{A,HL}$. The latch circuits 83 and 84 are designed to meet the condition, $P_{A,LH}>P_{A,HL}$.

The operation of the data holding circuit shown in FIG. 8 is the same as in the case of FIG. 7. When data IN is 1, a logical sum of outputs from the latch circuits 81 and 82, i.e. an output from the first data holding unit 850, is selected and produced from OUT. When data IN is 0, a logical product of outputs from the latch circuits 83 and 84, i.e. an output from the second data holding unit 860, is selected and produced from OUT. In any case, the output is not inverted unless the data in both the latch circuits 81 and 82 or the data in both the latch circuits 83 and 84 are inverted at the same time. Therefore, this embodiment can also realize a data holding circuit having a higher soft-error resistance than the majority voting circuit.

The conditions relating to the number of latch circuits to be added and the locations where latch circuits are added are the same as those in the case of FIG. 7. It is possible to preferentially add latch circuits to a circuit having a higher probability of occurrence of a soft error. Thereby, the occurrence of malfunction due to a soft error can be reduced while the increase in chip area is limited to a minimum.

In another possible modification, any one of the NOR circuit, OR circuit and AND circuit in FIGS. 7 and 8 may be replaced with a combination of a NAND circuit and an inverter. In this case, the same advantages as described above are also obtained.

According to one aspect of the present invention, there is provided a data holding circuit in which resistance to soft errors can be increased while an increase in chip area is suppressed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A data holding circuit comprising:
a first data holding unit in which a probability of a soft error at a time when input data has a first level is lower than a probability of a soft error at a time when the input data has a second level;
a second data holding unit in which a probability of a soft error at a time when the input data has the second level is lower than a probability of a soft error at a time when the input data has the first level; and
a selection unit that selects an output from the first data holding unit when the input data has the first level, and selects an output from the second data holding unit when the input data has the second level.

2. The device according to claim 1, wherein the first data holding unit includes a first latch circuit to which data corresponding to the input data is supplied, and the second data holding unit includes a second latch circuit to which data that is inverted data of the data supplied to the first latch circuit is supplied, and
in each of the first latch circuit and the second latch circuit, a probability of a soft error at a time when the data of the first level is supplied is lower than a probability of a soft error at a time when the data of the second level is supplied.

3. The device according to claim 1, wherein the first data holding unit includes a first latch circuit to which data corresponding to the input data is supplied, and the second data holding unit includes a second latch circuit to which data that is inverted data of the data supplied to the first latch circuit is supplied, and
the first latch circuit and the second latch circuit have the same circuit structure.

4. The device according to claim 2, wherein each of the first latch circuit and the second latch circuit includes an inverter and a clocked inverter, an output terminal of the inverter is connected to an input terminal of the clocked inverter, and an output terminal of the clocked inverter is connected to an input terminal of the inverter.

5. The device according to claim 3, wherein each of the first latch circuit and the second latch circuit includes an inverter and a clocked inverter, an output terminal of the inverter is connected to an input terminal of the clocked inverter, and an output terminal of the clocked inverter is connected to an input terminal of the inverter.

6. The device according to claim 2, wherein the first latch circuit and the second latch circuit are formed to have the same layout.

7. The device according to claim 3, wherein the first latch circuit and the second latch circuit are formed to have the same layout.

8. The device according to claim 1, wherein the first data holding unit includes a first latch circuit to which data corresponding to the input data is supplied, and the second data holding unit includes a second latch circuit to which the same data as the data supplied to the first latch circuit is supplied, and
a probability of a soft error at a time when the data of the first level is supplied to the first latch circuit is lower than a probability of a soft error at a time when the data of the second level is supplied to the first latch circuit, and a probability of a soft error at a time when the data of the second level is supplied to the second latch circuit is lower than a probability of a soft error at a time when the data of the first level is supplied to the second latch circuit, or
a probability of a soft error at a time when the data of the second level is supplied to the first latch circuit is lower than a probability of a soft error at a time when the data of the first level is supplied to the first latch circuit, and a probability of a soft error at a time when the data of the first level is supplied to the second latch circuit is lower than a probability of a soft error at a time when the data of the second level is supplied to the second latch circuit.

9. The device according to claim 8, wherein in the case where the probability of a soft error at a time when the data of the first level is supplied to the first latch circuit is lower than the probability of a soft error at a time when the data of the second level is supplied to the first latch circuit, and the probability of a soft error at a time when the data of the second level is supplied to the second latch circuit is lower than the probability of a soft error at a time when the data of the first level is supplied to the second latch circuit,
the probability of a soft error at a time when the data of the first level is supplied to the first latch circuit is lower than the probability of a soft error at a time when the data of the first level is supplied to the second latch circuit, and the probability of a soft error at a time when the data of the second level is supplied to the second latch circuit is lower than the probability of a soft error at a time when the data of the second level is supplied to the first latch circuit, and
in a case where the probability of a soft error at a time when the data of the second level is supplied to the first latch circuit is lower than the probability of a soft error at a time when the data of the first level is supplied to the first latch circuit, and the probability of a soft error at a time when the data of the first level is supplied to the second latch circuit is lower than the probability of a soft error at a time when the data of the second level is supplied to the second latch circuit,
the probability of a soft error at a time when the data of the second level is supplied to the first latch circuit is lower than the probability of a soft error at a time when the data of the second level is supplied to the second latch circuit, and the probability of a soft error at a time when the data of the first level is supplied to the second latch circuit is lower than the probability of a soft error at a time when the data of the first level is supplied to the first latch circuit.

10. The device according to claim 1, wherein the first data holding unit includes a first latch circuit to which data corresponding to the input data is supplied, and the second data holding unit includes a second latch circuit to which the same data as the data supplied to the first latch circuit is supplied, and
the first latch circuit and the second latch circuit have the same circuit structure and have different channel resistances of transistors that raise outputs to a high potential.

11. The device according to claim 8, wherein each of the first latch circuit and the second latch circuit includes an inverter and a clocked inverter, an output terminal of the inverter is connected to an input terminal of the clocked inverter, and an output terminal of the clocked inverter is connected to an input terminal of the inverter.

12. The device according to claim 10, wherein each of the first latch circuit and the second latch circuit includes an inverter and a clocked inverter, an output terminal of the inverter is connected to an input terminal of the clocked inverter, and an output terminal of the clocked inverter is connected to an input terminal of the inverter.

13. The device according to claim 8, wherein the first latch circuit and the second latch circuit are formed to have different layouts.

14. The device according to claim 10, wherein the first latch circuit and the second latch circuit are formed to have different layouts.

15. The device according to claim 10, wherein the transistors that raise the outputs to a high potential are pchannel MOS field-effect transistors, and the p-channel MOS field-effect transistors have different channel widths and thus have the different channel resistances.

16. The device according to claim 1, wherein the first data holding unit includes a first latch circuit to which data corresponding to the input data is supplied, and the second data holding unit includes a second latch circuit to which the same data as the data supplied to the first latch circuit is supplied, and
the first latch circuit and the second latch circuit have the same circuit structure and have different carrier mobilities in channels of transistors that raise outputs to a high potential.

17. The device according to claim 1, wherein the selection unit includes a first transmission gate that is connected to an output of the first data holding unit, and a second transmission gate that is connected to an output of the second data holding unit, and the data holding circuit further comprises a third transmission gate that is connected to an output of the first transmission gate and is controlled by a data holding state of the first data holding unit, and a fourth transmission gate that is connected to an output of the second transmission gate and is controlled by a data holding state of the second data holding unit.

18. The device according to claim 2, wherein the selection unit includes a first transmission gate that is connected to an output of the first data holding unit, and a second transmission gate that is connected to an output of the second data holding unit, and the data holding circuit further comprises a third transmission gate that is connected to an output of the first transmission gate and is controlled by a data holding state of the first data holding unit, and a fourth transmission gate that is connected to an output of the second transmission gate and is controlled by a data holding state of the second data holding unit.

19. The device according to claim 8, wherein the selection unit includes a first transmission gate that is connected to an output of the first data holding unit, and a second transmission gate that is connected to an output of the second data holding unit, and the data holding circuit further comprises a third transmission gate that is connected to an output of the first transmission gate and is controlled by a data holding state of the first data holding unit, and a fourth transmission gate that is connected to an output of the second transmission gate and is controlled by a data holding state of the second data holding unit.

20. The device according to claim 1, wherein the first data holding unit includes a first group of latch circuits to which data corresponding to the input data is supplied, and a first logic circuit to which outputs from the first group of latch circuits are supplied,
the second data holding unit includes a second group of latch circuits to which data corresponding to the input data is supplied, and a second logic circuit to which outputs from the second group of latch circuits are supplied, and
the first logic circuit inverts an output when all the outputs from the first group of latch circuits are inverted, and the second logic circuit inverts an output when all the outputs from the second group of latch circuits are inverted.

* * * * *